United States Patent
Bührend et al.

(10) Patent No.: US 6,342,827 B1
(45) Date of Patent: Jan. 29, 2002

(54) THERMAL FUSE FOR FIXING ON A CIRCUIT SUBSTRATE

(75) Inventors: Matthias Bührend, München; Frank Templin, Berlin, both of (DE)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/462,222

(22) PCT Filed: Jun. 18, 1998

(86) PCT No.: PCT/DE98/01678

§ 371 Date: Jan. 3, 2000

§ 102(e) Date: Jan. 3, 2000

(87) PCT Pub. No.: WO99/01879

PCT Pub. Date: Jan. 14, 1999

(30) Foreign Application Priority Data

Jul. 2, 1997 (DE) .......................... 197 28 255

(51) Int. Cl.[7] .......................... H01H 37/46; H01H 37/76
(52) U.S. Cl. .......................... 337/365; 337/362; 337/333; 337/343
(58) Field of Search .................. 337/166, 227, 337/296, 297, 291, 401–407, 333, 343, 362, 365

(56) References Cited

U.S. PATENT DOCUMENTS

| | | | | |
|---|---|---|---|---|
| 2,790,049 A | * | 4/1957 | McAlister | 200/142 |
| 3,638,083 A | * | 1/1972 | Dornfeld et al. | 317/247 |
| 3,763,454 A | * | 10/1973 | Zandonatti | 337/404 |
| 4,536,641 A | * | 8/1985 | Chan | 219/253 |
| 4,827,189 A | * | 5/1989 | Achter et al. | 313/623 |
| 5,280,262 A | * | 1/1994 | Fisher | 337/405 |
| 5,358,798 A | * | 10/1994 | Kleinert, III et al. | 429/7 |
| 5,600,295 A | * | 2/1997 | Kaufmann | 337/405 |
| 5,612,662 A | * | 3/1997 | Drekmeier et al. | 337/389 |
| 5,648,683 A | * | 7/1997 | Takahashi | 257/685 |
| 5,770,993 A | * | 6/1998 | Miyazawa et al. | 337/160 |
| 5,828,286 A | * | 10/1998 | Hofsass | 337/343 |
| 5,896,080 A | * | 4/1999 | Chen | 337/407 |

FOREIGN PATENT DOCUMENTS

DE 4337451 A1 * 5/1994 .................. 29/623

* cited by examiner

Primary Examiner—Leo P. Picard
Assistant Examiner—Anatoly Vortman
(74) Attorney, Agent, or Firm—Schiff Hardin & Waite

(57) ABSTRACT

In order to obtain a self-restoring fuse, it is proposed that a planar thermal bimetal snap element (1, 9) is provided that is secured on the circuit substrate (4) with refractory solder on the basis of at least one solder location and that is thermally coupled to the circuit substrate (4), whereby the solder location is fashioned as first contact location (5) for connection to a corresponding circuit contact of the circuit substrate, and that the snap element (1, 9) is mechanically pre-arched hump-like such that, when the fuse is not activated, it electrically conductively touches a second contact location of the circuit substrate (4) but does not touch it when the fuse has triggered and, thus, the hump curvature has reversed.

8 Claims, 4 Drawing Sheets

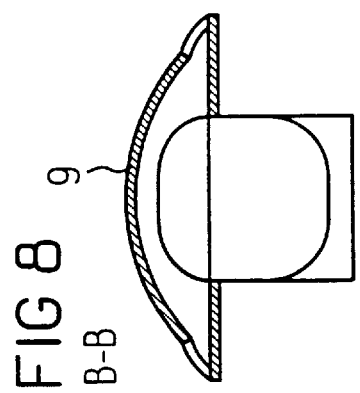
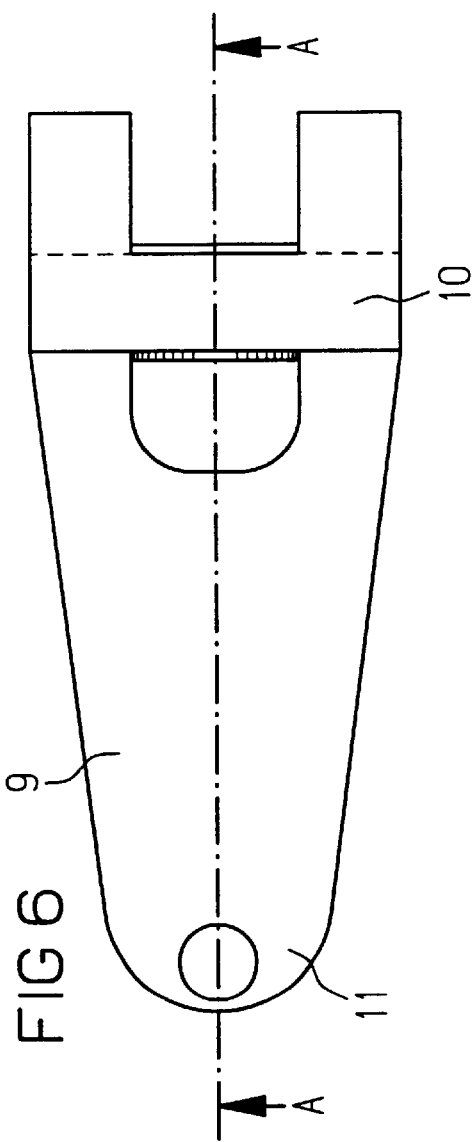
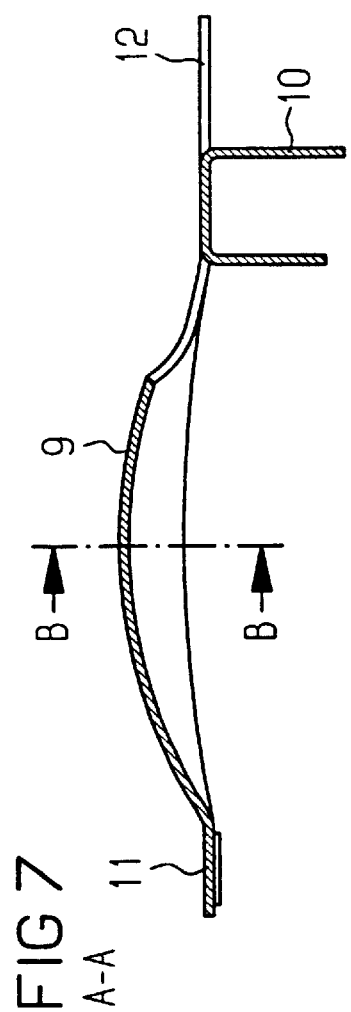

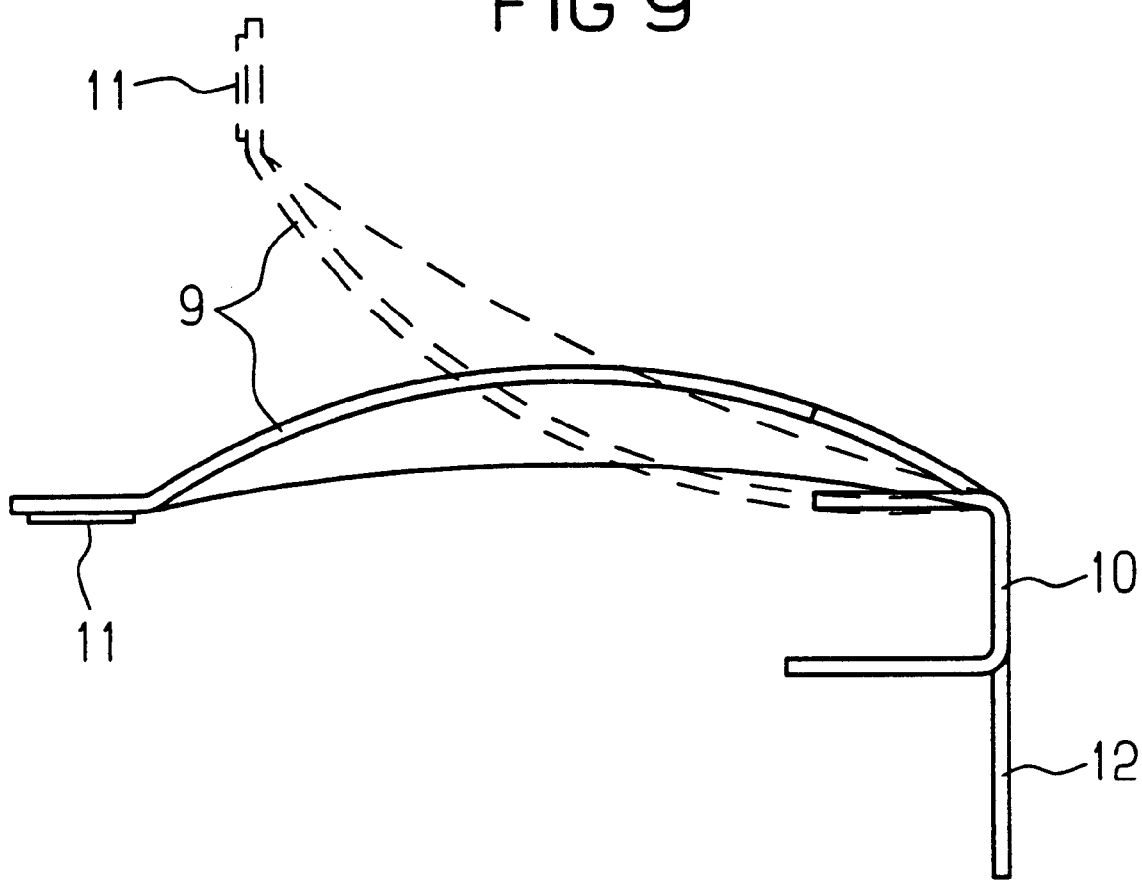

THERMAL FUSE FOR FIXING ON A CIRCUIT SUBSTRATE

BACKGROUND OF THE INVENTION

1. Field of the Invention

Such fuses serve the purpose of protecting circuit parts against thermal overload, particularly due to surge voltages, and can be utilized in arbitrary circuits, for example on printed circuit boards. A preferred employment of the inventive thermal fuse, is film circuits, particularly thick-film hybrid circuits as employed, for example, in telecommunications.

2. Description of the Prior Art

A thermal fuse of the species initially cited is disclosed, for example, by DE 42 19 554 A1. The fuse disclosed therein is a matter of a bow fuse that is secured at two solder points. The thermal fuse is electrically connected in series with a defined thick-film resistor in the ceramic substrate. When voltage is applied, the current that flows through heats the ceramic via the resistance layer, said ceramic thermally stressing at least one of the two solder locations of the fuse due to aptly selected hot spots and softening it given a current overload. The known bow fuse must first be pre-stressed after being soldered on, so that a spring clip—given overload—snaps away from the softened solder location and thus interrupts the electrical connection.

A bow fuse that was activated cannot be reset into the initial conditions and, replaced without further ado. What is also problematical given the known fuse type is that the softening process of the solder and—accompanying this the release of the spring clip and, the interruption of the current is a relatively slow and not very abrupt process.

SUMMARY OF THE INVENTION

The invention is therefore based on the object of creating a thermal fuse of the species initially cited that, on the one hand, can be utilized relatively universally in various circuits but that, on the other hand, can in turn be reset with optimally little outlay after an activation and that, moreover, should exhibit a fast and abrupt trigger behavior that assures a correct interruption of the current in case of malfunction.

In a thermal fuse of the species initially cited, this object is inventively achieved in that a planar thermal bimetal snap element is provided that is secured on the circuit substrate by at least one solder location with refractory solder and that is thermally coupled to the substrate, wherein the solder location is fashioned as first contact location for connection to a corresponding circuit contact of the circuit substrate;

and in that the snap element is mechanically pre-arched hump-like that, given a non-activated fuse, it electrically and conductively contacts a second contact location of the circuit substrate but does not when the fuse is triggered and, thus, the arch of the hump is reversed.

DESCRIPTION OF THE DRAWING

FIGS. 6–9 FIG. 6 shows a plan view. FIG. 9 shows a side view and FIGS. 7 and 8 respectively show a section through a non-activated fuse, wherein the activated condition is also indicated in FIG. 9.

DESCRIPTION OF THE PREFERRED EMBODIMENT

Figure 1:
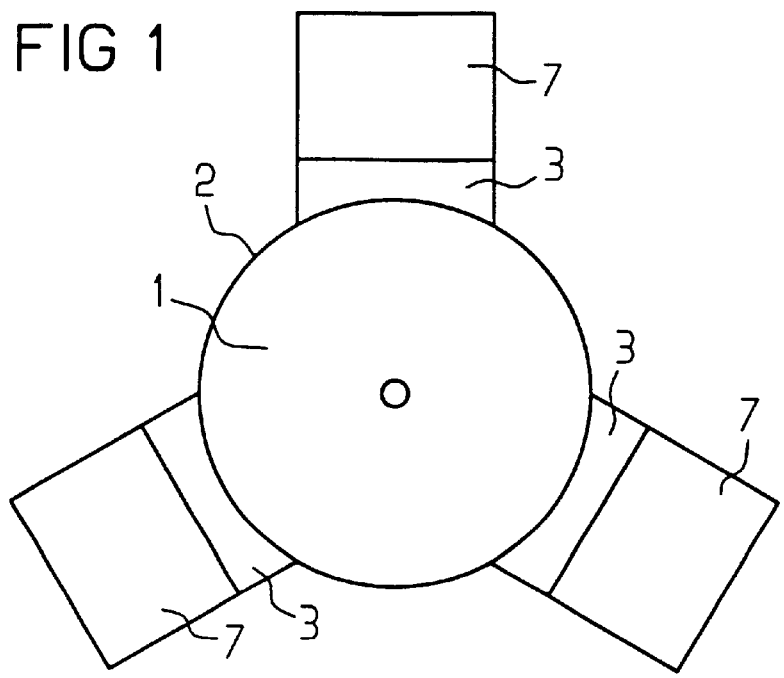
FIGS. 1–5 FIG. 1 shows a plan view and FIGS. 2 and 3 show a side view of an exemplary embodiment in the activated condition (FIG. 2) and a, non-activated (FIG. 3) condition of the fuse FIGS. 4 and 5 analogously show an exemplary embodiment according to the present invention.

The invention is based on a discontinuously working, thermal bimetal snap element that is secured on the circuit substrate with refractory solder.

In an embodiment, a thermal bimetal snap disk 1 is provided at whose arced edge 2 three metallic feet 3 are arranged, their ends being respectively secured on the circuit substrate 4 (see FIG. 3) with refractory solder in the form of a solder location, wherein one of the three solder locations is fashioned as first contact location 5 for connection to a corresponding circuit contact of the circuit substrate 4. Further, the snap disk 1 is mechanically pre-arched key-like downward toward the circuit substrate 1 such that, when the fuse has not responded, an electrical connection of the first foot 3 soldered to the first contact location 5 with a second contact location 6 of the circuit substrate 4 on which the center of the disk lies is present.

Given non-activation of the fuse, thus, the electrical connection is produced between the two contact locations 5, 6 of one of the feet 3 and the middle of the disk, which lies on a circuit contact in this condition. The known property of shape change of a bimetal when heated due to the different coefficients of thermal expansion of the two metals contained therein is utilized in a modified, specific way in the invention. The snap disk 1 is mechanically pre-arched approximately in the form of a key or hump below the operating temperature range, see FIGS. 3 and 5. As a result thereof, a discontinuity of the shape change and an automatic restoring mechanism are enabled.

Up to a specific temperature (upper snap temperature), the shape change is prevented by the geometry of the disk; above this temperature, the shape change is yielded to and the curvature—after adequate tension has built up—reverses very rapidly and abruptly into the other direction, as a result whereof the electrical contact is parted. The thermal contact with the circuit substrate 4, for example the ceramic, however, is preserved via, in particular, two of the feet 3 in that they are placed in hot spots of the substrate 4. The solder locations of the second and third foot 3 are, accordingly, arranged such on the circuit substrate 4 that they are in intimate thermal contact with thermally stressed circuit parts, particularly film resistors. When the circuit substrate 4 cools again after the surge voltage, the fuse restores the electrical contact given a renewed flipping of the disc curvature at a lower snap temperature. The working temperature range can be defined in a simple way on the basis of the geometrical dimensions of the snap disk 1.

In the release case of the fuse, the ceramic heats the snap disk 1 via the feet 3. Since this disk 1 comprises a relatively small size (diameter approximately 1 cm) and thickness (approximately 0.1 mm), this occurs very rapidly. The snap disk 1 flips over and parts the electrical contact. After cooling, the electrical contact is automatically restored. When an extremely high temperature load occurs in the extreme case, the two feet 3 serving for the thermal connection separate, as a result whereof an electrical connection cannot be restored after cooling. Advantageously, the thermal fuse does not fall off from the ceramic even in this extreme case, as required by applied practice.

The feet 3 visible in FIGS. 1 through 5 supply the necessary counter-force so that the snap disk I can arch us and back due to the inner stresses; however, they dare not be implemented too unstable. A one-piece connection of the feet 3 to the snap disk 1 lies at hand for cost reasons. In view of the mounting procedure of the thermal fuse, it is advantageous when—as shown in all Figures—the ends of the feet 3 are fashioned as contact tabs 7 that lie in one plane and form solder terminals. In this way, the ends of the feet 3 are suitably fashioned for an SMD mounting and solder technique, so that a plurality of thermal fuses can also be soldered in common in one work process in a reflow method. In order to assure a dependable contact in the non-activated condition of the fuse, the center of the snap disk arched downward toward the circuit substrate 4 can be advantageously provided with a contact nose 8 with gold plating, for example by coining.

Figure 2:
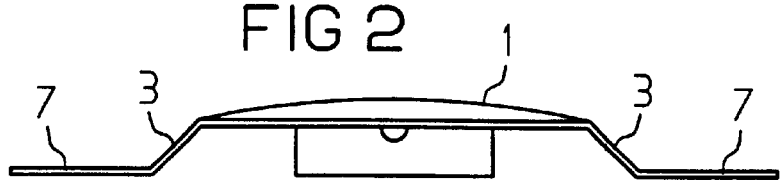
Figure 3:
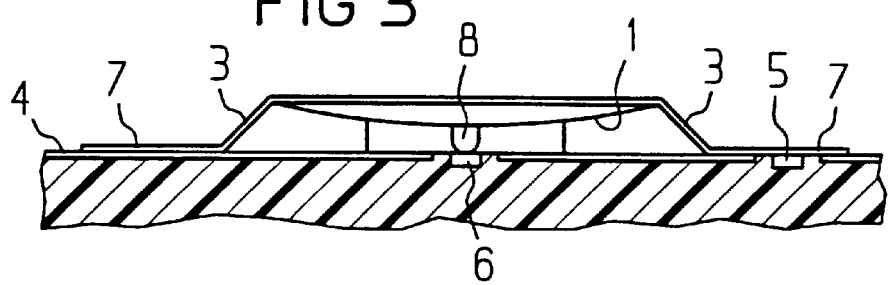
Figure 4:
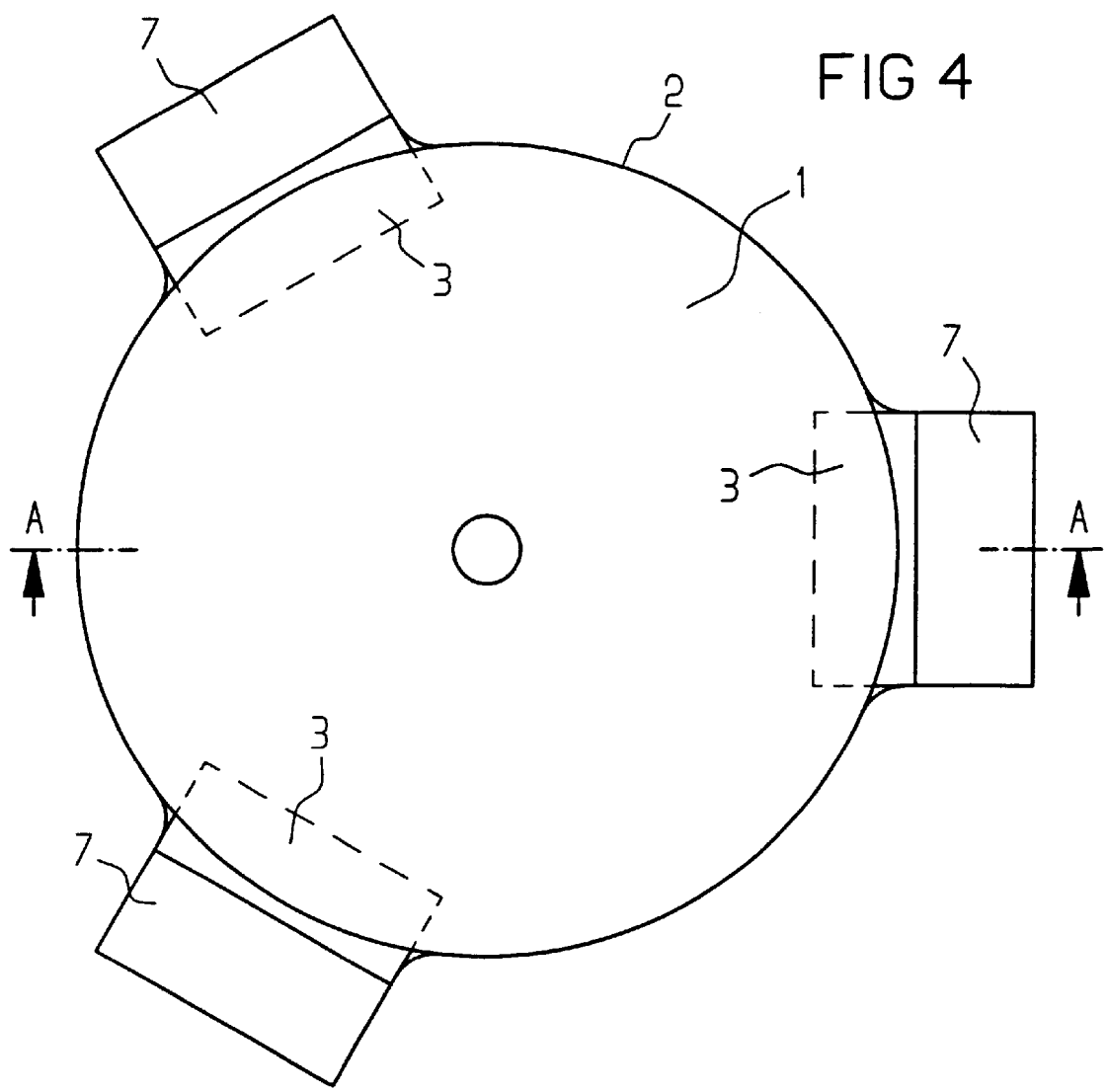
Figure 5:
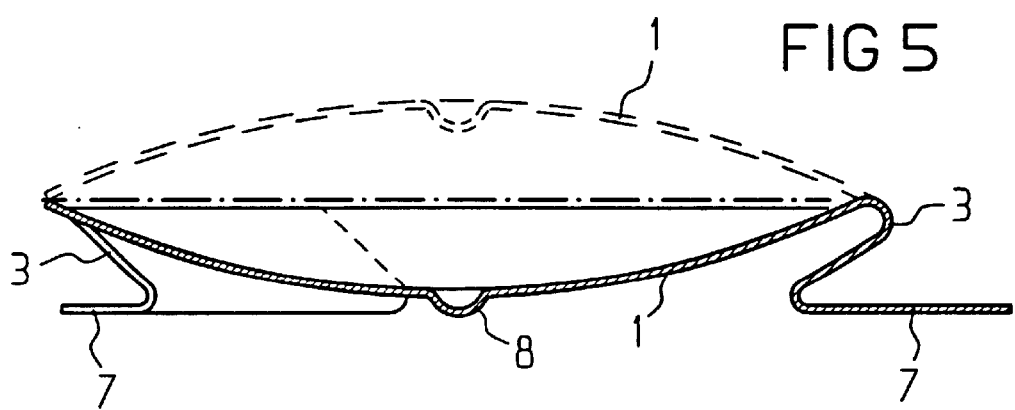

In order to cushion the forces acting on the feet 3 but also, in particular, in order to avoid a bouncing effect given the automatic restoring of the of the snap disk 1 into the deactivated condition, it is advantageous to fashion the feet 3 elastically. This can occur, for example, in one of the two way [sic] shown in FIGS. 2, 3, and, 5. The embodiment according to FIG. 5 is thereby more space-saving than that according to FIG. 2 and 3. In FIGS. 2, 3 and 5, moreover, the snap disk 1 is shown in the middle, planar transition condition between the two arched conditions. The relative smallness of the snap disk 1 produces a snap distance between the two arched conditions of only approximately 2 mm, which is advantageous in view of the installation height. The circuit substrate 4 as a whole, including the inventive thermal fuses, can itself in turn be surface-mounted, as warranted.

A second embodiment of the invention is shown in FIGS. 6 through 9.

With respect to the snap effect, the snap element 9 designed as half-oval with a hum-like or arcuate curvature—see FIG. 9—works in the same way as described above with reference to the snap disk 1. However, this embodiment is preferably suited for unforced plug-on with tie U-element 10 (press fit) onto the circuit substrate and subsequent soldering with refractory solder. During the switch and, flip event, the solder location need not intercept any shearing forces and the thermal coupling to the substrate is also advantageously solved in this way. The narrow end region 11 of the snap element 9 lying opposite the U-element 10 is brought from the touching situation shown with solid lines in FIG. 9, i.e. from the non-activated condition, into the position remote from the second contact location (reverse curvature of the arch) due to the flip-over process. An SMD suction grab 12 integrated in the snap element 9 is also shown.

Although modifications and changes may be suggested by those skilled in the art, it is the intention of the inventors to embody within the patent warranted hereon all changes and modifications as reasonably and properly come within the scope of their contribution to the art.

We claim:

1. A thermal fuse for fixing on a circuit substrate comprising:

a thermal bimetal snap element being thermally coupled to said circuit substrate in at least one location comprising a first contact location of said circuit substrate, said snap element having a curved portion extending toward the circuit substrate to form a contact with a second contact location of the circuit substrate to electrically connect the first contact location to the second contact location, the curved portion of said snap element during activation reversing the direction of curvature to open the contact between the snap element and the second contact location.

2. A thermal fuse according to claim 1, wherein the snap element has three feet being soldered to the circuit substrate.

3. A thermal fuse according to claim 2, wherein the curved portion has a mid-point forming the contact with the second contact location.

4. A thermal fuse for fixing on a circuit substrate comprising:

a planar thermal bimetal snap element being thermally coupled to said circuit substrate with a refractory solder at a plurality of solder locations, at least one of said solder locations comprising a first contact location for electrically connecting a respective second contact location of said circuit substrate;

said snap element contacting said second contact location during non-activation of said thermal fuse;

said snap element not contacting said second contact location during activation of said thermal fuse.

5. A thermal fuse for fixing on a circuit substrate comprising a snap element, three metallic feet, said three metallic feet having a first, second and third foot, each of said three metallic feet including a first and second end, said first end of each of said three metallic feet being secured to said snap element along a curved edge of said snap element, said second end of each of said three metallic feet being secured to said circuit substrate with a refractory solder at respective first, second and third solder locations, said first solder location comprising a first contact location, said snap element being mechanically pre-arched downward towards said circuit substrate and contacting a second contact location of said circuit substrate at a mid-region of said snap element during non-activation of said thermal fuse, said first contact location being electrically connected to said circuit substrate during said non-activation of said thermal fuse and the snap element being arched upward to lift the mid-region of the snap element out of contact with the second contact location during activation of the thermal fuse.

6. A thermal fuse according to claim 5 wherein said second and third metallic feet intimately contact said circuit substrate with thermally stressed circuit parts.

7. A thermal fuse according to claim 5 wherein each of said three metallic feet comprise elastic.

8. A thermal fuse according to claim 5 wherein said second end of each of said three metallic feet comprise a contact tab for forming a solder terminal at said solder location.

* * * * *